(12) United States Patent
Ferradino

(10) Patent No.: US 6,271,659 B1
(45) Date of Patent: Aug. 7, 2001

(54) INTEGRATED CIRCUIT SAMPLE PACKAGE FOR CHECKING ELECTRICAL FUNCTIONALITY AND ALIGNMENT OF CHECKING DEVICES AND CORRESPONDING CHECKING METHOD

(75) Inventor: Enzo Ferradino, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/342,929

(22) Filed: Jun. 29, 1999

(30) Foreign Application Priority Data

Jun. 30, 1998 (IT) ............................................... TO98A0567

(51) Int. Cl.[7] ............................. G01R 1/04; G01R 31/26; G01R 31/02
(52) U.S. Cl. ...................... 324/158.1; 324/765; 324/755; 324/756
(58) Field of Search .................................. 324/158.1, 765, 324/754, 757, 758, 761, 756, 755

(56) References Cited

U.S. PATENT DOCUMENTS

5,489,843 * 2/1996 Erjavic et al. .................... 324/158.1
6,043,442 * 3/2000 Park et al. ............................ 209/573

\* cited by examiner

Primary Examiner—Glenn W. Brown
Assistant Examiner—Anjan K Deb
(74) Attorney, Agent, or Firm—Theodore E. Galanthay; Stephen Bongini; Fleit, Kain, Gibbons, Gutman & Bongini P.L.

(57) ABSTRACT

An integrated circuit sample package is provided for checking electrical functionality and alignment of a checking device. The checking device includes a contactor and equipment for checking mechanical and electrical features of at least one integrated circuit device. The integrated circuit sample package substantially reproduces the external envelope of the integrated circuit device and is manufactured from an electrical conducting material that is resistant to mechanical wear. In one preferred embodiment, the integrated circuit sample package includes a body that substantially reproduces the external envelope of the body of the integrated circuit device, and offshoots that substantially reproduce the external envelope of the terminals of the integrated circuit device. A method for checking electrical functionality and alignment of a checking device is also provided. According to the method, an integrated circuit sample package that reproduces only the external envelope of the integrated circuit device is used in the checking. The integrated circuit sample package is manufactured from an electrical conducting material that is resistant to mechanical wear.

17 Claims, 3 Drawing Sheets

INTEGRATED CIRCUIT SAMPLE PACKAGE FOR CHECKING ELECTRICAL FUNCTIONALITY AND ALIGNMENT OF CHECKING DEVICES AND CORRESPONDING CHECKING METHOD

CROSS-REFERENCE TO RELATED APPLICATIONS

This application is based upon and claims priority from prior Italian Patent Application No. TO-98-A000567, filed Jun. 30, 1998, the entire disclosure of which is herein incorporated by reference.

BACKGROUND OF THE INVENTION

1. Field of the Invention

The present invention relates to integrated circuit devices, and more specifically to an integrated circuit sample package for checking electrical functionality and alignment of checking devices that check mechanical and electrical features of integrated circuit devices.

2. Description of Related Art

According to technologies connected with the manufacture of integrated electronic circuit devices, package technology (i.e., the housing, usually of plastic material, that contains the silicon chip and is fitted with terminals or pins for connecting the integrated circuit to other circuits or printed circuit boards) plays an important role. Assembly of the chip into the package is a highly automated process that includes a step for checking both the electrical continuity between the various terminals and their correct alignment. A faulty alignment can cause a missing connection when assembling and testing the integrated circuit.

Such a checking step is typically executed by handler robots that pick up single packages containing the integrated chips through special chutes or pick-and-place systems and convey them onto a contactor (i.e., a contact array) whose configuration and array correspond to the terminals to be checked. The check executed at this stage (i.e., when the package is on the contactor) can vary from checking electrical continuity only to input-output functional checks of the integrated circuit. Therefore, contactor alignment and good operation is of primary importance in allowing a reliable reproducible checking of the features of the integrated circuit device to be performed.

A simple method for checking both the alignment and good operation of the handler's contactor is to use real packages containing chips. However, this has several drawbacks. First, it uses a finished product and consequently wastes it due to wear following a certain number of tests. Additionally, even if classed in the same package category, there may be different products apart from the electronic function of the integrated circuit. In particular, the material used to manufacture the terminals can differ from one product to another, so resilience of the terminals under the contactor pressure can vary or the pitch between the terminals can be different. As a result, a different sample has to be used for each product.

Moreover, repeated tests cause fast sample wear and alter the mechanical dimensions so as to make the checking results no longer reproducible. More specifically, the mechanical dimension of primary interest is a coplanarity of the contactor contacts with respect to the terminals. This ensures that no circuits will be open-circuit during the checking operation due to bad contactor coplanarity. Additionally, the horizontal contact alignment in line with the terminals is important to avoid one or more contacts coming in line with spaces between the terminals and giving an open circuit signal.

Such horizontal alignment is particularly important when the contactor uses "Kelvin" type contacts (i.e., contacts with a second "sense" terminal to compensate for ohmic resistance losses due to direct current application). In such cases, one or more terminals will probably not be correctly aligned and will then cause false checking results, or even damage the test circuits. Besides coplanarity, a particularly significant mechanical dimension that should be maintained constant during checking is the "stand-off" (i.e., the distance between the contactor plane and the lower side of the package). If this distance changes (and in particular decreases), then some difficulties are caused during insertion of a sample into the contactor.

One conventional solution for addressing such drawbacks is to use an empty package (i.e., one without a chip inside) whose terminals are electrically short-circuited. However, this does not obviate all of the above mentioned drawbacks, and in particular the drawbacks related to mechanical wear. Further, it does not provide for the manufacture of package samples with mechanical dimensions with different tolerances (e.g., minimum and maximum limits) to allow calibration of contactor accuracy because production packages are used (i.e., having a predetermined tolerance and not necessarily predetermined dimensions).

SUMMARY OF THE INVENTION

In view of these drawbacks, it is an object of the present invention to overcome the above-mentioned drawbacks and to provide an integrated circuit sample package that has a more efficient and improved performance. The present invention provides integrated circuit sample packages and methods for checking electrical functionality and alignment of checking devices (e.g., in handler robots).

It is another object of the present invention to provide an integrated circuit sample package that allows the use of just one sample for one type of package.

A further object of the present invention is to provide an integrated circuit sample package that is highly resistant to mechanical wear.

Yet another object of the present invention is to provide an integrated circuit sample package that can be manufactured with mechanical dimensions of different tolerances.

One embodiment of the present invention provides an integrated circuit sample package for checking electrical functionality and alignment of a checking device. The checking device includes a contactor and equipment for checking mechanical and electrical features of at least one integrated circuit device. The integrated circuit sample package substantially reproduces the external envelope of the integrated circuit device and is manufactured from an electrical conducting material that is resistant to mechanical wear. In one preferred embodiment, the integrated circuit sample package includes a body that substantially reproduces the external envelope of the body of the integrated circuit device, and offshoots that substantially reproduce the external envelope of the terminals of the integrated circuit device.

Another embodiment of the present invention provides a method for checking electrical functionality and alignment of a checking device for checking mechanical and electric features of at least one integrated circuit device. According to the method, an integrated circuit sample package that reproduces only the external envelope of the integrated circuit device is used in the checking. The integrated circuit sample package is manufactured from an electrical conducting material that is resistant to mechanical wear. In one preferred method, the integrated circuit sample package is inserted and the checking device applied, and the impedance between each pair of contacts of the checking device is measured. If the impedance measurement indicates an open circuit with respect to one or more pairs of contacts, the checking device is adjusted.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 3c shows an operating stage of the integrated circuit sample package of FIG. 3a.

DETAILED DESCRIPTION OF PREFERRED EMBODIMENTS

Preferred embodiments of the present invention will be described in detail hereinbelow with reference to the attached drawings.

Figure 1C:
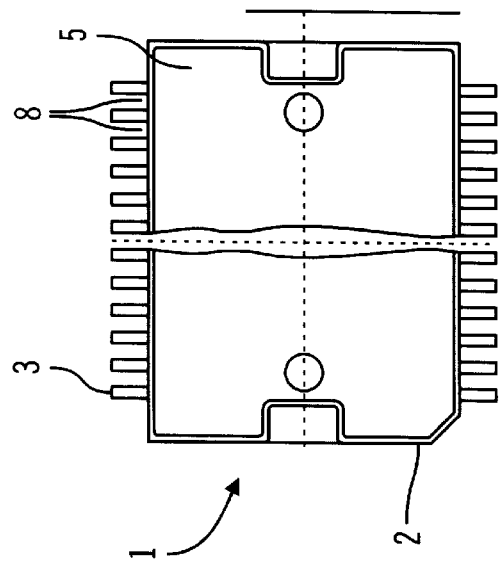
FIG. 1c shows a plan view of the conventional integrated circuit sample package.
Figure 1A:
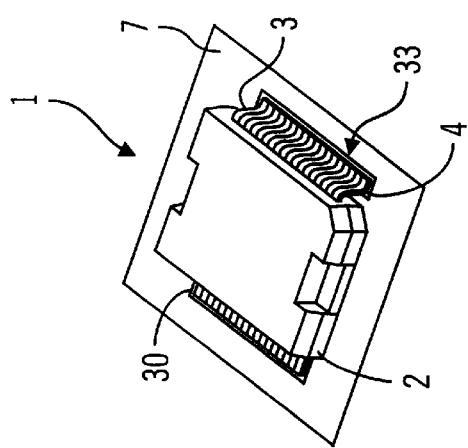
FIG. 1a shows a perspective view of conventional integrated circuit sample package.
Figure 1B:
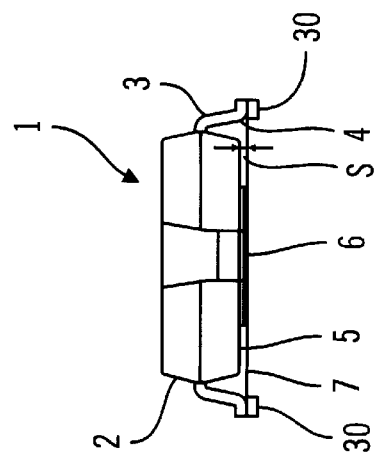
FIG. 1b shows a front view of the conventional integrated circuit sample package.

FIG. 1a shows a conventional integrated circuit sample package. The package 1 includes a body 2 molded from plastic material and a plurality of terminals 3 resting on a seat 7. The seat 7 consists of the plane delimited by the contacts 30 of a contactor 33. The package for semiconductor circuits 1 is generally representative of an integrated circuit device, but differs for the presence of the chip inside. As shown by the front view of the package in FIG. 1b, the terminals 3 consist of metal tabs with a foot 4 for welding or soldering on plates (not shown). The body 2 has a lower surface 5 on which a dissipator 6 is applied.

The lower surface 5 is raised with respect to the resting base of the foot 4 on the seat 7 by a distance known as the stand-off distance 5. FIG. 1c shows a plan view of the lower surface 5 of the package for semiconductors circuits 1. As shown, the terminals 3 are spaced between one another by spaces 8. The illustrated package for semiconductors circuits 1 corresponds to a PowerSO36 type manufactured by STMicroelectronics with the spaces 8 having a width of 0.35 mm and the terminals 3 having a width of 0.3 mm on average. There are 36 terminals for a PowerSO36 type, but only some are shown in the figures for simplicity.

Figure 2A:
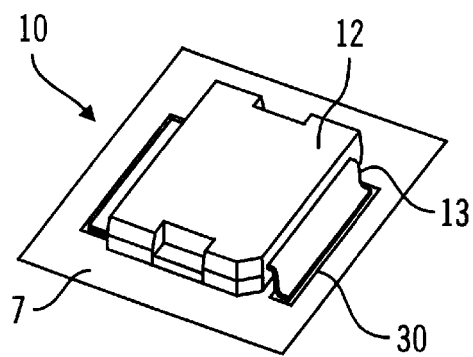
FIG. 2a shows a perspective view of an integrated circuit sample package according to a first embodiment of the present invention.
Figure 2B:
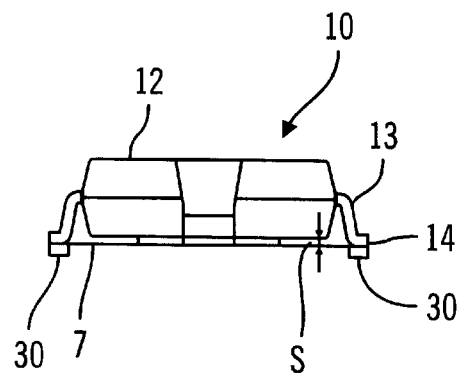
FIG. 2b shows a front view of the integrated circuit sample package according to the first embodiment.
Figure 2C:
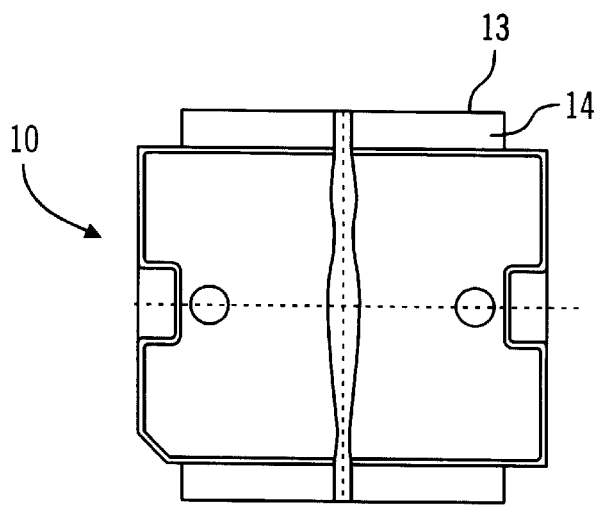
FIG. 2c shows a plan view of the integrated circuit sample package according to the first embodiment.

FIG. 2a shows a perspective view of an integrated circuit sample package according to a first embodiment of the present invention. As shown, the integrated circuit sample package 10 includes a body 12 and offshoots 13. The body 12 reproduces the shape of the body 2 of FIGS. 1a, 1b, and 1c, and the section of the offshoots 13 corresponds to the section of the terminals 3 (as better shown in FIG. 2b), except that the offshoots 13 have no spaces 8 between the terminals 3 and are configured like foils of continuous surface 14 (as clearly illustrated in FIG. 2c). Thus, the integrated circuit sample package 10 substantially reproduces the external envelope of the package for integrated circuits 1.

The body 12 and offshoots 13 are preferably manufactured as a stainless steel one-piece unit. As a result, the integrated circuit sample package 10 of the first embodiment can be used for repeated tests of the contactor 33 of a handler robot without any risk of wear because it is manufactured from a sturdy material (e.g., stainless steel). When the integrated circuit sample package 10 is placed on the contactor 33, the continuous surface 14 of the offshoots 13 operates as a short-circuit for the contacts 30, which signals a closed circuit and low impedance for all contacts 30 that are touched.

Figure 3A:
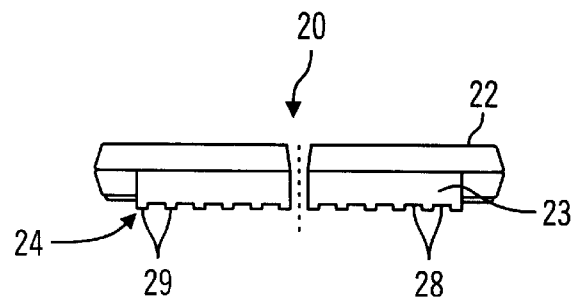
FIG. 3a shows a side view of an integrated circuit sample package according to a second embodiment of the present invention.
Figure 3B:
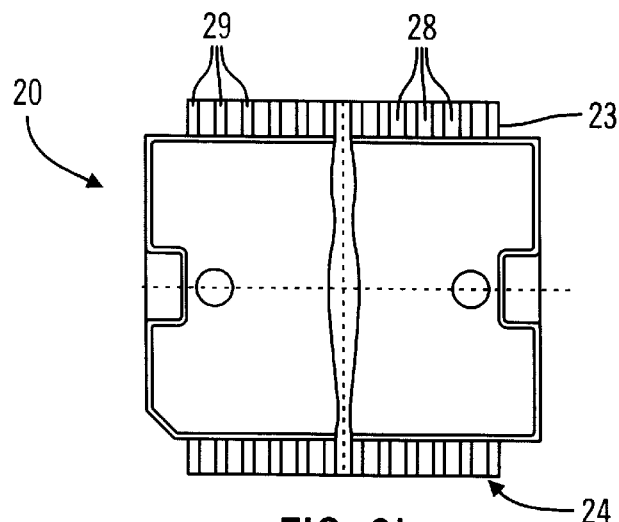
FIG. 3b shows a plan view of the integrated circuit sample package according to the second embodiment.

FIG. 3a shows a side view of an integrated circuit sample package according to second embodiment of the present invention. As shown, the integrated circuit sample package 20 of the second embodiment includes a body 22 (which is similar to bodies 2 and 12 of FIGS. 1a and 2a, respectively), and offshoots 23 with a lower surface 24 bearing grooves 28 that delimit some steps 29. Preferably, the grooves 28 have the same size as the spaces 8 of FIG. 1c and the steps 29 have the same size as the terminals 3 of FIG. 1c.

Figure 3C:
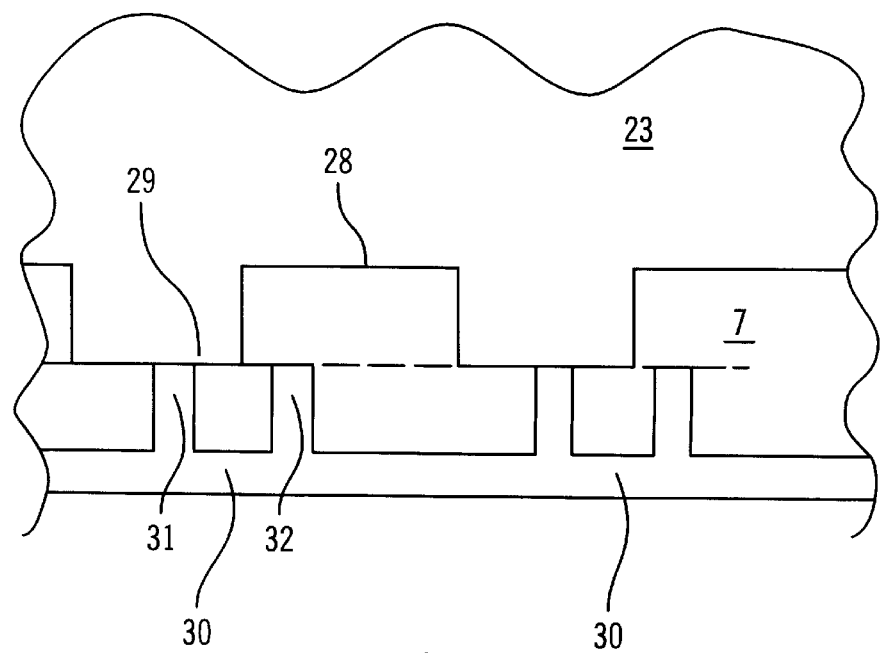

FIG. 3c shows a "Kelvin" type contact 30 (i.e., consisting of two terminals 30 and 32). In this embodiment, terminal 31 is in line with step 29, and terminal 32 is in line with groove 28. Thus, electric continuity is only ensured for terminal 31, and a measurement with an ohmmeter or similar device indicates a low impedance (i.e., a correct alignment indication). As for terminal 32, the ohmmeter reports a very high impedance (i.e., an open circuit) to indicate a bad alignment. Because the contact 30 is pushed with a considerable force against the offshoot 23, the terminal 32 may also come into contact with the groove surface 28 and close the ohmmeter circuit. Therefore, it may be appropriate to cover the groove surface 28 with isolating material such as a simple isolation paint or scratch-proof coating (e.g., a Diamond Like carbon layer).

To obtain sample packages with mechanical dimensions of different tolerances, it is enough to prepare a set of samples with the desired tolerances.

A preferred method for checking both the electric continuity and contactor alignment in accordance with the present invention is as follows. The integrated circuit sample package (e.g., 10 or 20) is inserted into the handler robot and the contactor 33 is applied. Then, the impedance between each pair of contacts 30 is measured. If a low impedance is measured on all contacts 30, the contactor 33 is properly operating and correctly aligned. On the other hand, if an open circuit is measured with respect to one or more pairs of contacts 30, it is necessary to adjust the space position of the contactor through appropriate adjustments.

Such a method for checking the electric continuity and contactor alignment is performed by the handler robot, which is fitted with appropriate measuring instruments and control programs for fast measurement of all contacts 30. However, the integrated circuit sample package of the present invention also allows checking to be performed with any simple resistivity measuring instrument (e.g., an ohm-meter or tester) by dismantling the contactor from the handler robot.

The integrated circuit sample package of the present invention can be advantageously employed for checking handler robots operating on various integrated circuits identified by the same type of package (e.g., those with different types of terminals). Thus, a sample package for each product is not required. Moreover, the integrated circuit sample package of the present invention can advantageously be manufactured from metal materials that are extremely resistant to the wear caused by repeated tests. This allows the structure of the offshoots simulating the feet is apt to withstand repeated check tests without deformation, so the wear problem is virtually eliminated.

Further, because the integrated circuit sample package is manufactured fully independent of the products for which it should operate as a pattern and only reproduces the dimensions of the package body and pins, the sample package can be manufactured with different tolerances so as to change the accuracy required for checking the contactor. Additionally, the integrated circuit sample package of the present invention allows checking contactor operation with a simple measuring device (such as an ohmmeter) even with the handler robot off or with the contactor disassembled. Also, the use of grooved offshoots advantageously allows efficient checking of contactors with "Kelvin" type terminals or refined adjustments with respect to the horizontal position.

In further embodiments of the present invention, the components differ in form and/or size from those described above and can be replaced with equivalent elements. Further, the integrated circuit sample package of the present invention can be manufactured using other metals and materials, so long as the material being used offers good electrical conduction properties and resistance to mechanical wear.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit sample package for use in checking a checking device, the checking device including a contactor for contacting terminals of a real integrated circuit device package during normal operation, said integrated circuit sample package comprising:
   a body that substantially reproduces the external envelope of a body of the real integrated circuit device package; and
   offshoots that substantially reproduce the external envelope of the terminals of the real integrated circuit device package, at least the upper portion of the offshoots being a continuous surface without spaces between the terminals,
   wherein the integrated circuit sample package substantially reproduces the external envelope of the real integrated circuit device package and is manufactured from an electrical conducting material that is resistant to mechanical wear.

2. The integrated circuit sample package as defined in claim 1, wherein said integrated circuit sample package is manufactured as a one-piece unit.

3. The integrated circuit sample package as defined in claim 2, wherein the electrical conducting material is stainless steel.

4. The integrated circuit sample package as defined in claim 1, wherein the lower portion of the offshoots is also a continuous surface without spaces between the terminals.

5. The integrated circuit sample package as defined in claim 1, wherein the offshoots have a lower portion with grooves and steps whose dimensions are substantially similar to the dimensions of the terminals and spaces between the terminals.

6. The integrated circuit sample package as defined in claim 5, wherein the grooves are covered with an insulating material.

7. The integrated circuit sample package as defined in claim 1, wherein said integrated circuit sample package has a manufacturing tolerance in its mechanical dimensions, the manufacturing tolerance being predetermined for checking performance of a handler robot that includes the checking device.

8. A method for checking a checking device having a plurality of contacts, the checking device being of the type used for checking a real integrated circuit device package during normal operation, said method comprising the step of:
   providing an integrated circuit sample package that reproduces only the external envelope of the real integrated circuit device package and that is manufactured from an electrical conducting material that is resistant to mechanical wear, the integrated circuit sample package including offshoots that substantially reproduce the external envelope of terminals of the real integrated circuit device package, at least the upper portion of the offshoots being a continuous surface without spaces between the terminals; and
   contacting the offshoots of the integrated circuit sample package with the contacts of the checking device.

9. The method as defined in claim 8, further comprising the steps of:
   measuring the impedance between pairs of the contacts of the checking device; and
   if the impedance measurement indicates an open circuit with respect to one or more pairs of the contacts, adjusting the contacts of the checking device.

10. The method as defined in claim 9,
   wherein the checking device is part of a handler robot, and
   the measuring step is preformed with the checking device separated from the handler robot.

11. The method as defined in claim 8, wherein the checking device is part of a handler robot, and the integrated circuit sample package has a manufacturing tolerance in its mechanical dimensions, the manufacturing tolerance being predetermined for checking performance of the handler robot.

12. The method as defined in claim 8, wherein the integrated circuit sample package is a one-piece unit.

13. The method as defined in claim 12, wherein the electrical conducting material is stainless steel.

14. The method as defined in claim 8, wherein the integrated circuit sample package further includes a body that substantially reproduces the external envelope of a body of the real integrated circuit device package.

15. The method as defined in claim 8, wherein the lower portion of offshoots is also a continuous surface without spaces between the terminals.

16. The method as defined in claim 8, wherein the offshoots have a lower portion with grooves and steps whose dimensions are substantially similar to the dimensions of the terminals and spaces between the terminals.

17. The method as defined in claim 16, wherein the grooves are covered with an insulating material.

* * * * *

UNITED STATES PATENT AND TRADEMARK OFFICE
CERTIFICATE OF CORRECTION

PATENT NO. : 6,271,659 B1
DATED : August 7, 2001
INVENTOR(S) : Vincenzo Ferradino It is certified that error appears in the above-identified patent and that said Letters Patent is hereby corrected as shown below:

<u>Title page,</u>
Under Inventor, please change "Enzo Ferradino" to -- Vincenzo Ferradino --

Signed and Sealed this

Twenty-sixth Day of March, 2002

*Attest:*

JAMES E. ROGAN
*Attesting Officer*     *Director of the United States Patent and Trademark Office*